(12) United States Patent
Kavia et al.

(10) Patent No.: US 12,074,779 B2
(45) Date of Patent: Aug. 27, 2024

(54) MEDIA SLICE TRACKING IN A COMMUNICATIONS NETWORK USING DATA PACKET COMPARISON

(71) Applicant: MICROSOFT TECHNOLOGY LICENSING, LLC, Redmond, WA (US)

(72) Inventors: Anish Kavia, Slough (GB); Salem Amin Al-Damluji, Chorleywood (GB)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 16 days.

(21) Appl. No.: 18/107,432

(22) Filed: Feb. 8, 2023

(65) Prior Publication Data

US 2024/0195724 A1 Jun. 13, 2024

(30) Foreign Application Priority Data

Dec. 8, 2022 (GB) ...................................... 2218511

(51) Int. Cl.
*H04L 43/106* (2022.01)
*H04L 43/04* (2022.01)
*H04L 65/40* (2022.01)
*H04L 65/75* (2022.01)

(52) U.S. Cl.
CPC ............ *H04L 43/106* (2013.01); *H04L 43/04* (2013.01); *H04L 65/40* (2013.01); *H04L 65/75* (2022.05)

(58) Field of Classification Search
CPC ....... H04L 43/106; H04L 43/04; H04L 65/40; H04L 65/75
See application file for complete search history.

(56) References Cited

U.S. PATENT DOCUMENTS

2005/0169190 A1* 8/2005 Mathieu .............. H04L 43/0852
370/252
2009/0034976 A1* 2/2009 Sprague ............. H04Q 11/0062
398/79

(Continued)

FOREIGN PATENT DOCUMENTS

EP 2944056 A1 11/2015

OTHER PUBLICATIONS

International Search Report and Written Opinion received for PCT Application No. PCT/US23/036222, Feb. 9, 2024, 12 pages.

*Primary Examiner* — Johnny B Aguiar
(74) *Attorney, Agent, or Firm* — Han Gim; Newport IP, LLC

(57) ABSTRACT

Examples are disclosed herein relating to a method performed by a remote capture server, of tracking a media slice through at least part of a communications network comprising a plurality of network elements, the method comprising: inspecting a first payload of a first data packet observed at an egress capture point of a first network element, inspecting a second payload of a second data packet observed at an ingress capture point of a second network element, comparing the first payload with the second payload and associating the first data packet with the second data packet in response to determining that the first payload and the second payload are the same, wherein the first and second data packets correspond to a first media slice in response to determining they are associated.

20 Claims, 10 Drawing Sheets

(56) References Cited

U.S. PATENT DOCUMENTS

| | | | |
|---|---|---|---|
| 2011/0141937 A1* | 6/2011 | Breslin | H04L 67/63 709/224 |
| 2015/0341271 A1* | 11/2015 | Cortes Gomez | H04L 47/11 370/236 |
| 2016/0285744 A1* | 9/2016 | Panchagnula | H04L 12/18 |
| 2017/0222881 A1* | 8/2017 | Holbrook | H04L 43/0876 |
| 2019/0166057 A1 | 5/2019 | Gilson | |
| 2020/0186584 A1 | 6/2020 | Srinivasan et al. | |

* cited by examiner

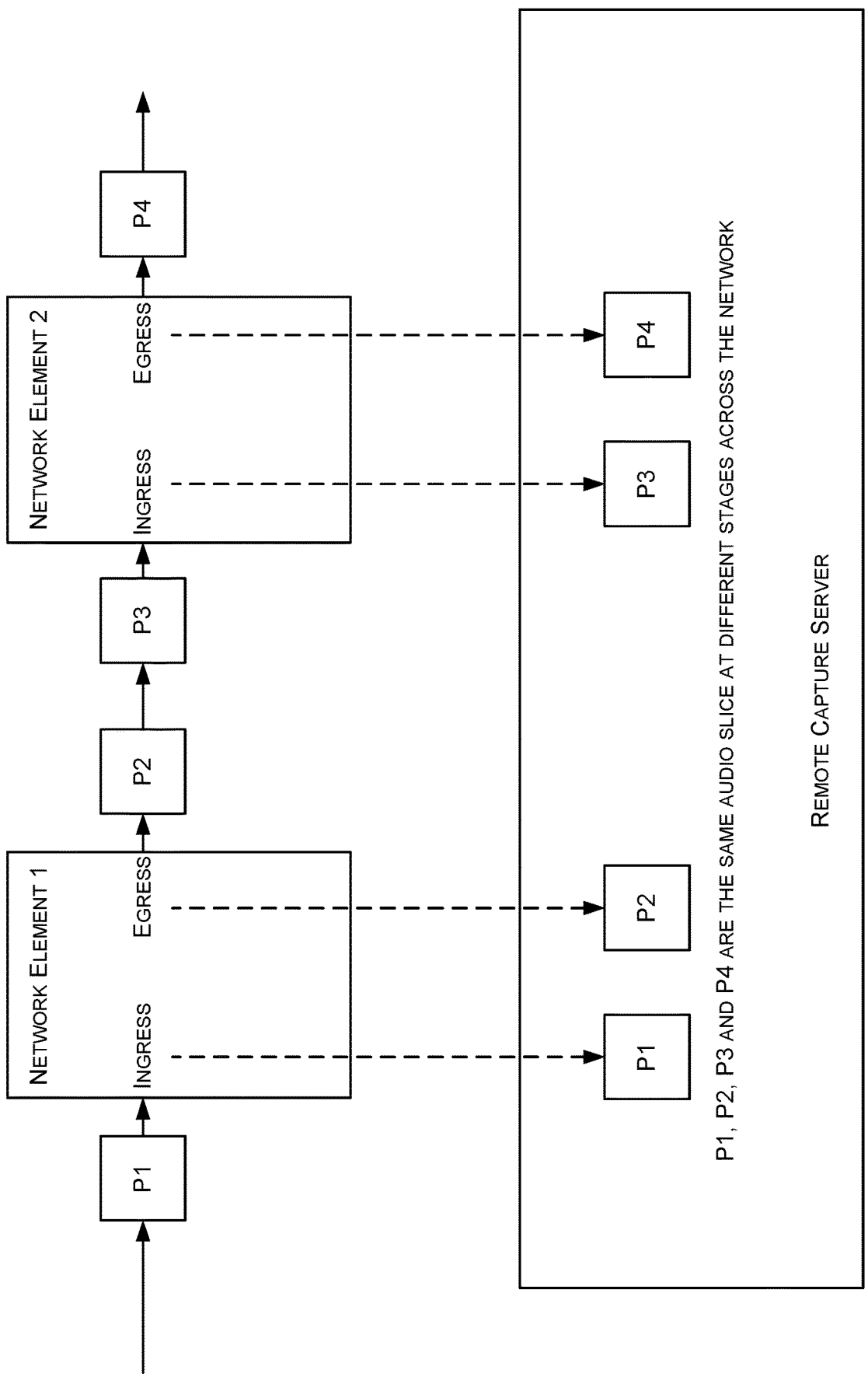

500

┌─────────────────────────────────────────────────────────┐
│ INSPECTING A FIRST PAYLOAD OF A FIRST DATA PACKET OBSERVED │
│ AT AN EGRESS CAPTURE POINT OF A FIRST NETWORK ELEMENT.   │
│ 502                                                      │
└─────────────────────────────────────────────────────────┘
                              ↓
┌─────────────────────────────────────────────────────────┐
│ INSPECTING A SECOND PAYLOAD OF A SECOND DATA PACKET      │
│ OBSERVED AT AN INGRESS CAPTURE POINT OF A SECOND NETWORK │
│ ELEMENT.                                                 │
│ 504                                                      │
└─────────────────────────────────────────────────────────┘
                              ↓
┌─────────────────────────────────────────────────────────┐
│ COMPARING THE FIRST PAYLOAD WITH THE SECOND PAYLOAD.     │
│ 506                                                      │
└─────────────────────────────────────────────────────────┘
                              ↓
┌─────────────────────────────────────────────────────────┐
│ ASSOCIATING THE FIRST DATA PACKET WITH THE SECOND DATA   │
│ PACKET IN RESPONSE TO DETERMINING THAT THE FIRST PAYLOAD │
│ AND THE SECOND PAYLOAD ARE THE SAME, WHEREIN THE FIRST AND │
│ SECOND DATA PACKETS CORRESPOND TO A FIRST MEDIA SLICE IN │
│ RESPONSE TO DETERMINING THAT THE FIRST AND SECOND DATA   │
│ PACKETS ARE ASSOCIATED.                                  │
│ 508                                                      │
└─────────────────────────────────────────────────────────┘
                              ↓
┌─────────────────────────────────────────────────────────┐
│ INSPECTING A THIRD PAYLOAD AND/OR METADATA OF A THIRD DATA │
│ PACKET OBSERVED AT THE INGRESS CAPTURE POINT OF THE      │
│ SECOND NETWORK ELEMENT.                                  │
│ 510                                                      │
└─────────────────────────────────────────────────────────┘
                              ↓
┌─────────────────────────────────────────────────────────┐
│ INSPECTING FOURTH PAYLOAD AND/OR METADATA OF A FOURTH    │
│ DATA PACKET OBSERVED AT THE EGRESS CAPTURE POINT OF THE  │
│ SECOND NETWORK ELEMENT.                                  │
│ 512                                                      │
└─────────────────────────────────────────────────────────┘
                              ↓

COMPARING THE THIRD PAYLOAD AND/OR METADATA OF THE THIRD DATA PACKET WITH THE FOURTH PAYLOAD AND/OR METADATA OF THE FOURTH DATA PACKET.
514

↓

ASSOCIATING THE THIRD DATA PACKET WITH THE FOURTH DATA PACKET IN RESPONSE TO DETERMINING THE THIRD PAYLOAD AND/OR METADATA OF THE THIRD DATA PACKET AND THE FOURTH PAYLOAD AND/OR METADATA OF THE FOURTH DATA PACKET ARE THE SAME, WHEREIN THE THIRD AND FOURTH DATA PACKETS CORRESPOND TO A SECOND MEDIA SLICE IN RESPONSE TO DETERMINING THAT THE THIRD AND FOURTH DATA PACKETS ARE ASSOCIATED.
516

IN RESPONSE TO DETERMINING THAT THE SECOND DATA PACKET AND THE THIRD DATA PACKET ARE THE SAME DATA PACKET, ASSOCIATING THE FIRST, SECOND OR THIRD AND FOURTH DATA PACKETS.
518

IN RESPONSE TO DETERMINING THAT THE SECOND DATA PACKET AND THE THIRD DATA PACKET ARE NOT THE SAME DATA PACKET, RECORDING THE FIRST AND SECOND MEDIA SLICES AS DIFFERENT MEDIA SLICES.
522

RECORDING THE FIRST AND SECOND MEDIA SLICES AS A COMMON MEDIA SLICE.
520

GENERATING A GRAPHICAL REPRESENTATION OF THE NETWORK ELEMENTS AND THE MEDIA SLICES FOR DISPLAY TO A USER.
524

```
┌─────────────────────────────────────────────────────┐
│  INSPECTING A FIRST TIMESTAMP ASSIGNED TO THE FIRST DATA │
│                       PACKET.                        │
│                         602                          │
└─────────────────────────────────────────────────────┘
                          ↓
┌─────────────────────────────────────────────────────┐
│  INSPECTING A SECOND TIMESTAMP ASSIGNED TO THE SECOND OR │
│                  THIRD DATA PACKET.                  │
│                         604                          │
└─────────────────────────────────────────────────────┘
                          ↓
┌─────────────────────────────────────────────────────┐
│  INSPECTING A THIRD TIMESTAMP ASSIGNED TO THE FOURTH DATA │
│                       PACKET.                        │
│                         606                          │
└─────────────────────────────────────────────────────┘
                          ↓
┌─────────────────────────────────────────────────────┐
│  INSPECTING A FOURTH TIMESTAMP ASSIGNED TO A FIFTH DATA │
│                       PACKET.                        │
│                         608                          │
└─────────────────────────────────────────────────────┘
                          ↓
┌─────────────────────────────────────────────────────┐
│   ESTIMATING A TIME OFFSET BETWEEN THE FIRST AND SECOND │
│                  NETWORK ELEMENTS                    │
│                         610                          │
└─────────────────────────────────────────────────────┘
                          ↓
┌─────────────────────────────────────────────────────┐
│  APPLYING THE TIME OFFSET TO THE FIRST, SECOND, THIRD AND │
│  FOURTH TIMESTAMPS TO GENERATE FIRST, SECOND, THIRD AND │
│              FOURTH CORRECTED TIMESTAMPS.            │
│                         612                          │
└─────────────────────────────────────────────────────┘
                          ↓
┌─────────────────────────────────────────────────────┐
│  RECORDING IN THE LOG THE CORRECT TIMESTAMPS WITH THEIR │
│              ASSIGNED DATA PACKETS.                  │
│                         614                          │
└─────────────────────────────────────────────────────┘
                          ↓
┌─ ─ ─ ─ ─ ─ ─ ─ ─ ─ ─ ─ ─ ─ ─ ─ ─ ─ ─ ─ ─ ─ ─ ─ ─ ─ ┐
│  ORDERING AT LEAST ONE OF THE FIRST, SECOND, THIRD, FOURTH │
│    AND FIFTH DATA PACKETS ACCORDING TO THE VALUES OF THE │
│  CORRECTED TIMESTAMPS FOR THE FIRST, SECOND, THIRD, FOURTH │
│                AND FIFTH DATA PACKETS.               │
│                         616                          │
└─ ─ ─ ─ ─ ─ ─ ─ ─ ─ ─ ─ ─ ─ ─ ─ ─ ─ ─ ─ ─ ─ ─ ─ ─ ─ ┘
```

FIG. 6

MEDIA SLICE TRACKING IN A COMMUNICATIONS NETWORK USING DATA PACKET COMPARISON

CROSS-REFERENCE TO RELATED APPLICATION(S)

This non-provisional utility application claims priority to UK patent application number 2218511.0 entitled "MEDIA SLICE TRACKING IN A COMMUNICATIONS NETWORK" and filed on Dec. 8, 2022, which is incorporated herein in its entirety by reference.

BACKGROUND

Communications networks, such as voice over internet protocol (VoIP) networks and other types of packet-based communications network facilitate media services such as video/audio calls and audio/video streaming by enabling the transfer of media such as any one or more of: images, videos, audio signals between computing devices.

Degraded performance or quality is a common issue encountered when providing media services in communications networks. Examples of poor media quality include but are not limited to: pixelated video, loss of video, loss of audio, noisy audio.

The embodiments described below are not limited to implementations which solve any or all of the disadvantages of known ways of tracking media flows in communications networks.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

Tracking media slices through a communications network is useful for identifying causes of media quality problems, such as where video, audio or other services are provided in a VOIP communications network.

In various examples there is a method, performed by a remote capture server, of tracking a media slice through at least part of a communications network comprising a plurality of network elements, the method comprising: inspecting a first payload of a first data packet observed at an egress capture point of a first network element, inspecting a second payload of a second data packet observed at an ingress capture point of a second network element, comparing the first payload with the second payload and associating the first data packet with the second data packet in response to determining that the first payload and the second payload are the same. The first and second data packets correspond to a first media slice in response to determining they are associated. The method further comprising: inspecting a third payload and/or metadata of a third data packet observed at the ingress capture point of the second network element, inspecting a fourth payload and/or metadata of a fourth data packet observed at the egress capture point of the second network element, comparing the third payload and/or metadata of the third data packet with the fourth payload and/or metadata of the fourth data packet and associating the third data packet with the fourth data packet in response to determining the third payload and/or metadata of the third data packet and the fourth payload and/or metadata of the fourth data packet are the same. The third and fourth data packets correspond to a second media slice in response to determining they are associated. In response to determining that the second data packet and the third data packet are the same data packet: associating the first, second or third, and fourth data packets, and recording the first and second media slices as a common media slice. In response to determining that the second data packet and the third data packet are not the same data packet: recording the first and second media slices as different media slices.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 2C is a diagram representing ingress to egress and egress to ingress association of data packets.

FIGS. 5A and 5B are a flow diagram for an example method of associating data packets.

FIG. 6 is a flow diagram for a method of generated corrected timestamps for data packets.

Like reference numerals are used to designate like parts in the accompanying drawings.

DETAILED DESCRIPTION

Figure 1:
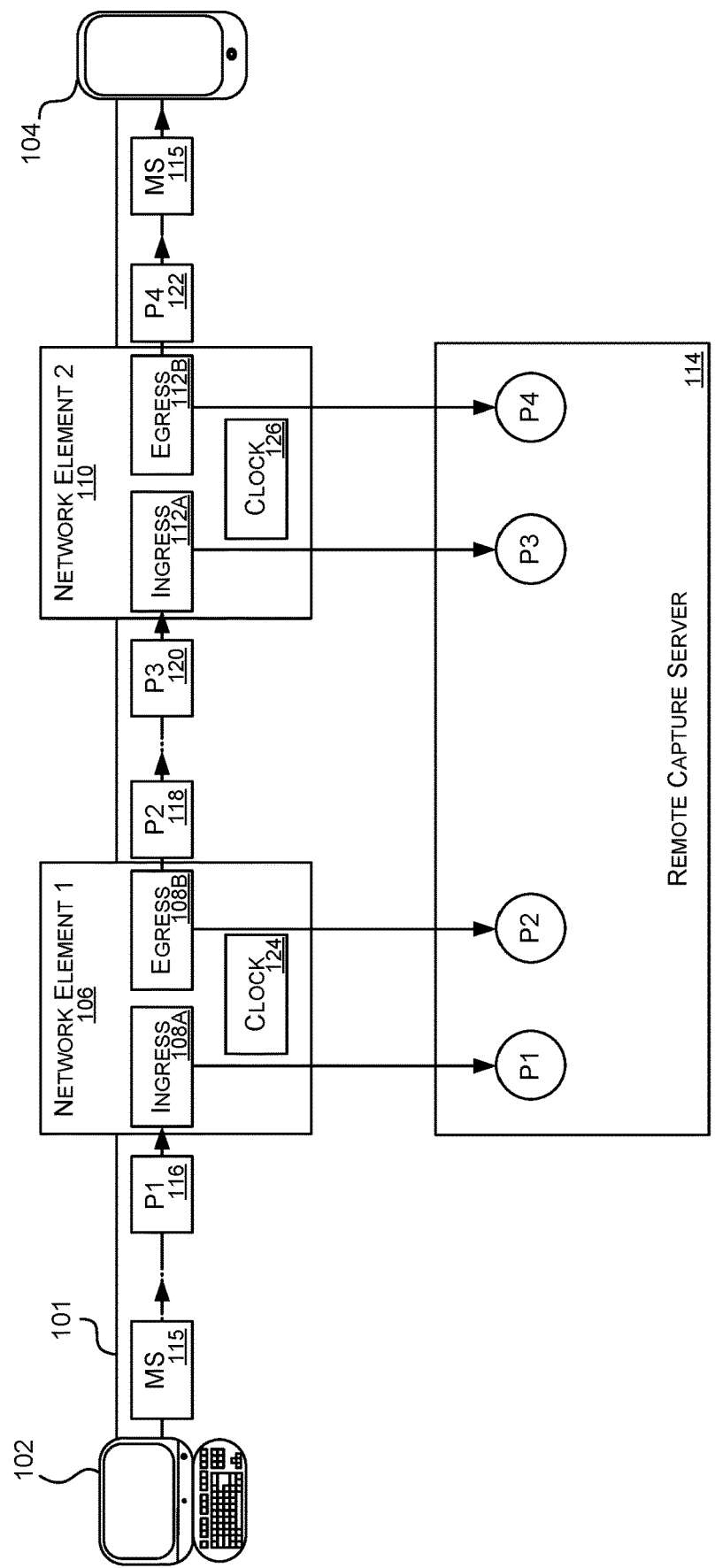
FIG. 1 is a diagram representing a communications network for facilitating the transfer of media slices.

The detailed description provided below in connection with the appended drawings is intended as a description of the present examples and is not intended to represent the only forms in which the present examples are constructed or utilized. The description sets forth the functions of the examples and the sequence of operations for constructing and operating the examples. However, the same or equivalent functions and sequences may be accomplished by different examples.

As mentioned above, degraded performance or quality is a common issue encountered when providing media services in a communications network such as a VoIP network or other packet-based communications network. At the same time, there is increasing demand for media services and for high quality of media service performance. Problems with media quality may arise for a variety of different reasons, which are combinable. A non-exhaustive list of examples of causes of media quality issues is: hardware fault at a communications network node, congestion at a communications network node or edge, firmware or software bug at the communications network node, incompatibility of two or more communications network nodes, poor latency in the network, and high packet loss through the network.

Investigation and diagnosis of degraded media service quality is time consuming and complex. Complexity is introduced because of the large number of different possible causes of media quality problems and different combinations of those causes. Complexity is introduced by the scale of the problem (the size of the communications network may be very large, such as in the case of an intranet or the internet) and the amount of traffic in the communications network may also be very large. Current approaches to diagnosing poor media service quality are mainly manual and are complex and time consuming. However, there is a desire to diagnose media quality issues within a matter of minutes or seconds, so that automated operations may be carried out to improve media service quality. Often diagnosis of media quality problems involves identifying a specific part of a communications network architecture (e.g., a network element or part of a network element) which is responsible, in one example, for failing to perform an assigned task.

The inventors have recognized, that in order to accurately diagnose poor media quality, tracking how media slices are processed by a communications network is extremely important. A media slice is part of a media stream and comprises media content of the media stream intended to be output to a user at one particular time instant or time interval. Thus a media slice comprises media content that typically has some semantic meaning to a user. Thus, if there is poor media quality, there will be poor quality of media slices since poor media quality is perceived by a user as content which is degraded or absent. By tracking media slices within a communications network, technical causes of the poor media quality may be identified and subsequently remedied, potentially automatically. In contrast, investigating individual parts of the communications network may not help with addressing media quality for a particular media service, since an individual communications network node may have a fault which is identified but it may be a fault that has no impact on the media quality. Thus, examining each node of a communications network potentially finds lots of faults and yet some of those faults may not have anything to do with the particular poor media quality being experienced.

The term "media slice" refers to underlying media content, however represented for a particular time period. For an audio call between Alice and Bob, define a media slice (M1) as the audio being transmitted from Alice to Bob between t=100 ms and t=120 ms. In other words, M1 is a 20 ms long piece of audio travelling from Alice to Bob. Note that M1 is defined as the audio (i.e. the sound of Alice's voice on the telephone call), and not particular representation of the audio. If the representation of the audio changes (e.g. following transcoding) then M1 is unchanged. Thus a media slice is a segment or portion of media content independent of how the media content is represented. Where packet-based communications networks are used, such as VoIP networks, media content is divided into portions and stored in payloads of packets. The packets are then sent through the communications network. Individual packets may experience different journeys or treatments as they pass through the communications network. A destination computing entity has to receive packets and reconstruct a media slice before presenting the media slice to an end user. As explained above a media slice is independent of how the media content is represented (i.e. the individual packets). Content which is a single media slice may be in a payload of part of a packet, or a single packet or a plurality of packets.

Tracking media slices in a communications network such as a telecommunications network is not straightforward because any available measurements or logs about traffic in communications networks is typically about packets and not about media slices. Manually trying to interpret such measurements and logs to understand what they mean about media slices is not practically possible and even if it were practically possible is likely to be error prone.

Individual media slices traverse across a communications network and pass-through multiple network elements before being received by an intended recipient. A network element is any node within a communications network where a data packet which may be all or part of a media slice is received before being sent to another network element or an intended final recipient of the data packet. The network element may perform actions on data packets before sending the data packets. Data packets may be recorded at ingress and egress capture points of network elements and these records, including relevant information about the media stream, may be reported to a central diagnostic server. However, as mentioned above, logs about packets are not easily understood in terms of media slices.

Tracking information regarding which network elements a media slice passes through enables identification of errors in the communications network. As an illustrative example, if multiple corrupt media slices are received, the tracking information associated with each of the media slices may reveal they passed through a common network element. The common network element may therefore be investigated to diagnose the issue and/or automatically instructed to undergo automated maintenance such as by download and install of firmware and/or software upgrades, automatic restart, automatic reconfiguration or other automated maintenance.

Providing a log or timeline of how a specific media slice has traversed a network is challenging for a number of reasons. Properties of the media slice may be altered as it passes through different network elements. For example, the way the content is represented changes according to whether encryption is used, whether video or audio codecs are applied or for other reasons. The way the content is represented at different layers of a communications network may also change. As a result, the media slice appears as a plurality of disconnected data packets being recorded at different parts of the network at different times. This is in addition to the large volume of data packets traversing a network during a media related activity. For example, consider a 5 minute VOIP call as a media slice, it may use 120,000 packets. A 5 minute VOIP call is 300 seconds long and if there are 50 packets per second in the audio stream that gives 15000 packets. Where there are two adjacent network nodes, each with two ingresses and two egresses that gives 15,000 times 8 packet observations in total over the two network nodes, which is 120,000 packet observations related to the media slices.

Providing a timeline of locations for a specific media slice is difficult due to the changing properties of packets used to communicate the content of the media slice. This problem is exacerbated by large volumes of data packets and the desire for real time or near real time operation.

Embodiments described herein provide a method of associating data packets to media slices enabling a record of which network elements a media slice has passed through to be provided.

In various examples described herein, associating data packets with media slices is achieved by inspecting the payload of a data packet exiting at the egress of a first network element and comparing said payload with the payload of a data packet entering at the ingress of a second network element. The method associates the two data packets (exiting the first network element and entering the second network element) if the payloads are the same. The association provides an indication the data packets hold content of a common media slice. The association provides an indication that the data packets hold content of the same media slice. When a packet is observed exiting the egress of the first network element, that observation of payload content is matched to content of a packet at an ingress of the second network element. Since the content matches it is likely the content is from the same media slice and has been observed in packets at different times at the egress and the ingress.

In various examples described herein, associating data packets with media slices is achieved by inspecting the payload and/or metadata of a data packet as it enters at the ingress of a network element (e.g., such as the second network element described above) and comparing said payload and/or metadata with the payload and/or metadata of a data packet exiting at the egress of the network element. The method associates the two data packets (entering and exiting the network element) if there are consistencies between the payloads and/or metadata of the data packets. The association providing an indication the data packets correspond to a common media slice.

If a data packet entering at the ingress of a network element has previously been associated with another data packet egressing a different network element and is also associated with a data packet exiting at the egress of the network element, then this indicates the three data packets all correspond to a common media slice.

Whilst identifying which data packets correspond to a specific media slice is useful for diagnostics, the order of events as a media slice traverses a network provides more detailed information for diagnosis. For example, knowing that a data packet passed through a first network element before it passed through a second network element may indicate if data transfer from the first to the second network element or data transfer from the second to the first network element is responsible for degraded network performance.

In examples, when the ingress and egress of data packets from a network element is reported to a central diagnostic server the report includes a timestamp which records when a data packet arrived at an ingress capture point or when a data packet exited from an egress capture point. The timestamps are generated by internal clocks within each network element. However, the internal clocks amongst network elements are generally not synchronized. For example, two timestamps generated at the same time may have a value T=1 at one network element whereas the timestamp may have a value T=5 at a second network element.

A solution is to calculate a calibration between network elements, however in practice this is not a viable solution. Firstly, the internal clocks may differ by a substantial amount compared to the frequency at which data packets are received. Secondly, and perhaps more importantly, the internal clocks of each network element may drift relative to one another over time. For example, the internal clocks of two network elements may drift relative to one another during a VoIP call.

Embodiments described herein provide a method of calculating offsets between the internal clocks of network elements when data packets having content of a single media slice are sent from a first network element and received by a second network element. These offsets are calculated on a per data packet basis meaning the offset between two internal clocks is calculated using information relating to the data packets themselves.

This is achieved by inspecting the time stamps of data packets associated with one another where said time stamps are generated by different network elements. A first timestamp for a first data packet exiting (a send event) a first network element is inspected and compared to an inspected second timestamp for a second data packet entering (a receive event) a second network element where the first and second data packets are associated to one another. The first and second data packets are associated to one another since they both hold content of the same media slice. A third timestamp for a third data packet exiting (a send event) the second network element is inspected and compared to an inspected fourth timestamp for a fourth timestamps entering (a receive event) the first network element where the third and fourth timestamps are associated to one another. The timestamps are generated by the network element where the capture point (ingress or egress point) is located (e.g., the timestamp for the first data packet is generated by the first network element).

The method uses the difference in the send event timestamp from the first network element and the receive event timestamp from the second network element and/or the difference in the send event timestamp from the second network element and the receive event timestamp from the first network element to estimate an offset between the internal clocks of the first and second network elements. This offset is specific to the time at which the data packets are sent thus providing increased time recording granularity to account for clock drift between network elements.

FIG. 1 shows a communications network 100 which facilitates the transfer of media slices between computing devices, such as computing device 102 and computing device 104. The computing devices are connected via a communications network which comprises a plurality of network elements. The solid line 101 illustrates a communications network link between the network elements and the computing devices. FIG. 1 shows first 106 and second 110 network elements linking the computing devices, however it will be appreciated that more than two network elements may be connected between the computing devices. A network element is any communications network node of a packet-based communications network. A network element has functionality to receive data packets and to send data packets to another network element or an intended final recipient of the data packet. A non-exhaustive list of examples of network element is: a session border controller, a firewall, a media gateway, a datacenter compute node, servers, softswitches etc.

Within a network elements are ingress and egress capture points. An ingress capture point is where the network element will capture an incoming media slice and an egress capture point is where the network element will capture the outgoing media slice. The first network element having ingress 108A and egress 108B capture points and the second network element also having ingress 112A and egress 112B capture points. When a data packet is received at an ingress capture point or sent from an egress capture point, a copy of the data packet comprising a payload and metadata associated with the data packet, along with a timestamp, is sent to a remote capture server 114. In some examples, a copy of the data packet is encapsulated within another data packet so the original data packet is unchanged as it travels to the remote capture server 114. The data packet itself continues on its route through the communications network. The remote capture server 114 records the data packet information along with the temporal information associated with the data packet. The remote capture server 114 then discards the copy of the data packet. The recorded data packet information is used to track media slices. The tracked media slices are used for automatic investigation and diagnosis of any media quality issues. Using a remote capture server to carry out inference on packet data in order to track media slices is found to be efficient and accurate in practice. The data captured by the remote capture server about packets observed at different locations and times in the communications network is measured accurately. The data is then processed efficiently using rules to achieve mapping to media slices.

The timestamps assigned to the data packets when they enter or exit a capture point are generated by internal clock of the network element in which the capture point is located. FIG. 1 shows the first network element having an internal clock 124 and the second network element having an internal clock 126 for generating the timestamps.

As an illustrative example, a media slice 115 is sent by the first computing device 102. In some embodiments, the media slice is made up of audio or video data. It is received by a first network element 106 at the ingress capture point 108A as all or part of data packet (P1) 116. The metadata associated with P1 is sent to the remote capture server 114 along with a timestamp. A second data packet (P2) 118 exits the first network element 106 at the egress capture point 108B. The metadata associated with P2 is sent to the remote capture server 114 along with a timestamp.

P1 and P2 are recorded as separate data packets by the remote capture server 114. Although P1 and P2 correspond to the same media slice 115, they may have different properties due to how the data packets are processed within a network element. The networking layers of the data packets may be different (e.g., different ethernet, internet protocol (IP) and user datagram protocol (UDP) header, etc.). The media may be differently represented (e.g., different codecs, packetization timer (ptimes), whether the secure real-time transport protocol (SRTP) is in use or not, etc.). Audio in the media slice may also be changed (e.g., the first network element could be carrying out dual tone multi-frequency (DTMF) injection or squelching, or injecting an announcement, etc.).

A third data packet (P3) 120 enters the second network element 110 at the ingress capture point 112A. The metadata associated with P3 is sent to the remote capture server 114 along with a timestamp. P2 and P3 are recorded as separate data packets by the remote capture server 114. P2 and P3 may have different properties despite corresponding to the same media slice 115. For example, any or all of the network layers may have been changed in transit (e.g., by a network address translation (NAT)), by encryption, by application of a codec or in other ways.

A fourth data packet (P4) 122 exits the second network element 110 at the egress capture point 112B. The metadata associated with P4 is sent to the remote capture server 114 along with a timestamp. P3 and P4 are recorded as separate data packets by the remote capture server 114. P3 and P4 may have different properties for the same reasons as those described for P1 and P2. The media slice 115 arrives at the second computing device 104.

In the example illustrated in FIG. 1, the 'footprints' left by the media slice 115 are recorded in the form of the data packets (P1, P2, P3 and P4) and the payloads, metadata associated with the data packets and timestamps are reported to the remote capture server 114 to record details of the media slice's traversal of the network. Such a record is useful to a network engineer or a diagnostic application when identifying at what points in a network media quality problems have occurred.

However, for the remote capture server 114 to generate this record, it determines that each of the data packets (P1, P2, P3 and P4) are associated with one another and correspond to a common media slice. The remote capture server uses the timestamps to confirm the order in which the capture point events (ingress/egress of data packets) took place. Ordering the capture point events chronologically is complicated due to the internal clocks of network elements being unsynchronized and/or drifting relative to one another through time. The examples described herein provide a method implemented by the remote capture server 114 to perform such associations and time reconciliation of the internal clocks of the network elements. These methods are implemented without the need to carry out dedicated calibration. Since the methods for ordering the capture point events use observations about existing packets there is no unnecessary increate in network traffic due to having to send dedicated calibration packets.

Alternatively, or in addition, the functionality of the remote capture service described herein is performed, at least in part, by one or more hardware logic components. For example, and without limitation, illustrative types of hardware logic components that are optionally used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), Graphics Processing Units (GPUs).

Figure 2A:
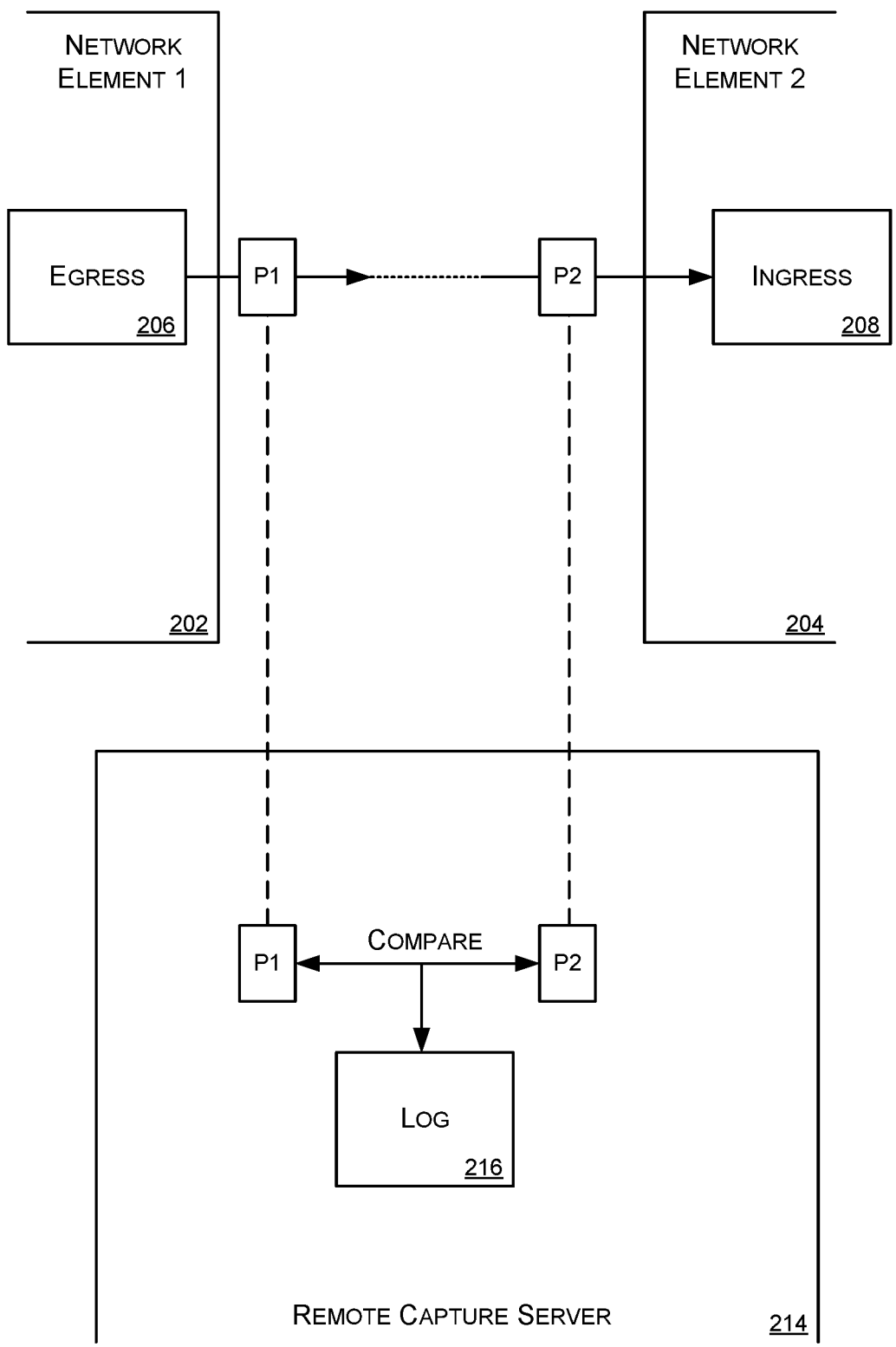
FIG. 2A is a diagram representing egress to ingress association of data packets.

FIG. 2A illustrates the process of associating two data packets captured at the egress capture point 206 of a first network element 202 and at the ingress capture point 208 of a second network element 204 as being part of the same media slice.

The remote capture server 214 receives, from the first network element 202, a first data packet (P1) captured at the egress capture point of the first network element. The remote capture server also receives, from a second network element, a second data packet (P2) captured at the ingress capture point of the second network element. The data packets P1 and P2 both comprise a payload and metadata associated with the data packet. The payloads (e.g., real-time transport protocol (RTP) payload, or real-time transport control protocol (RTCP) payload) of P1 and P2 are then compared by the remote capture server. P1 is associated with P2 by the remote capture server 214 if the payloads are the same (i.e. the media content in the payloads is the same). The remote capture server 214 records the association between P1 and P2 in a log 216 indicating that they both correspond to a common media slice.

The process in FIG. 2A enables automated association between data packets such that the path taken by a media slice through a network can be tracked and used in the diagnosis of degraded media quality. Because the process is automated and stored in a log 216 in the remote capture server, the record is usable in solutions that automatically identify where in a network is responsible for media quality problems, since the log can be used as an input into a preprogrammed diagnosis application.

Figure 2B:
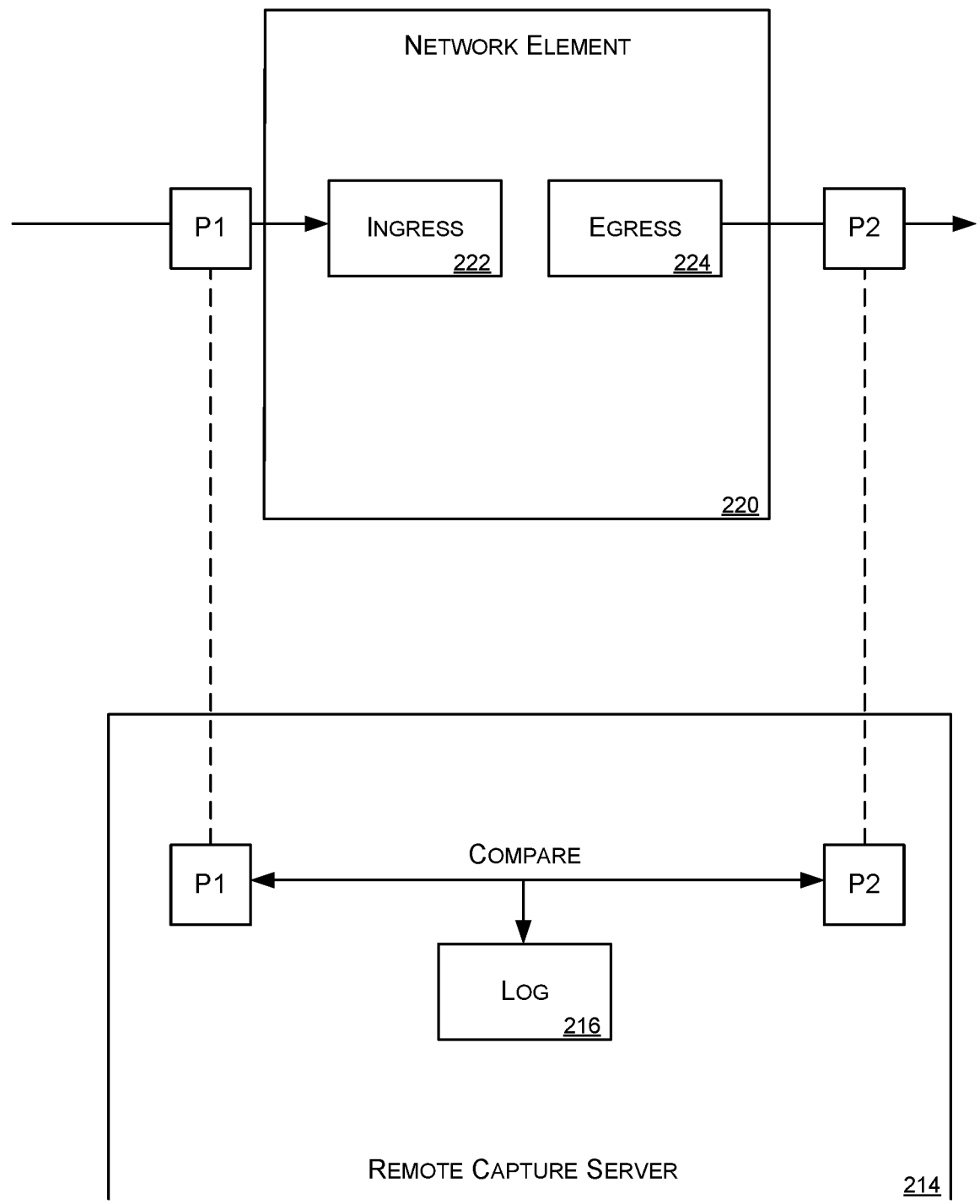
FIG. 2B is a diagram representing ingress to egress association of data packets.

FIG. 2B illustrates the process of associating two data packets, where one data packet is captured at the ingress capture point 222 of a network element 220 and the second packet is captured at the egress capture point 224 of the same network element 220.

The remote capture server receives, from a network element, a third data packet (P3), comprising a payload and metadata associated with P3, captured at the ingress capture point 222 of the network element 220. The remote capture server also receives, from the network element, a fourth data packet (P4), comprising a payload and metadata associated with P4, captured at the egress capture point of the network element. The remote capture server compares the payloads and/or metadata associated with P3 and P4.

P3 is associated with P4 if one or more of the following is satisfied: the RTP payloads are unchanged (which is also described in reference to FIG. 2A), and/or the RTP packets are equal under the relevant process of transcoding or SRTP (secure real-time transport protocol) interworking, and/or other internal diagnostic log indications such as assessing the transrating protocol from the metadata of the third and fourth data packets (where the packetization at the ingress and egress of the network element is compared.).

In one embodiment, the conditions for associating P3 with P4 (i.e., a data packet received from an ingress capture point of a network element and a data packet received from an egress capture point of the same network element) are determined based on the central processing unit (CPU) resource of the remote capture server. For example, if the remote capture server has limited CPU resource P3 and P4 are associated if the RTP payloads are unchanged. If the remote capture server has substantial CPU resource P3 and P4 are associated if the conditions described previously are met. This example provides a method of data packet association which is flexible so it can be implemented on a variety of computing resources with a range of CPU capabilities. Therefore, there is a greater range of network resources which can be allocated the remote capture server tasks contributing to a more robust network performance diagnosis method.

In some embodiments, the association between packets and media slices is based on the assumption that the remote capture server knows the inbound and outbound codecs and/or the remote capture server knows the inbound and outbound SRTP encryption keys of the network element. This assumption is reasonable since the remote capture server has access to the session initiation protocol (SIP) that has set up the session comprising the transfer of media packets. The remote capture server 214 records the association between P3 and P4 indicating that they both correspond to a common media slice in a log 216.

FIG. 2C illustrates the process of associating four data packets where the first data packet (P5) is captured at the ingress capture point of a first network element 250, the second data packet (P6) is captured at the egress capture point of the first network element 250, the third data packet (P7) is captured at the ingress capture point of a second network element 260, and the fourth data packet (P8) is captured at the egress capture point of the second network element 260.

FIG. 2C shows P5 being associated with P6, and P7 being associated with P8 in the same way P3 and P4 were associated in the illustrated example of FIG. 2B. FIG. 2C also shows P6 being associated with P7 in the same way P1 and P2 were associated in the illustrated embodiment of FIG. 2A.

FIG. 2C shows that by applying both methods for egress-ingress and ingress-egress associations to a collection of data packets, a chain of data packet events can be recorded. By applying these methods over a network connected between a first computing device sending a media slice to a second computing device receiving the media slice a chain of data packet events can be recorded reflecting the traversal of an individual media slice across the network. Thus, the example illustration in FIG. 2C provides a record of which network elements a media slice has passed through.

To generate a more complete picture, providing the time at which each data packet corresponding to a common media slice is captured at each part of the network means the data packet capture events throughout the network can be ordered chronologically. However, as discussed above, this is not a trivial task due to discrepancies and drift between the internal clocks of different network elements.

Figure 3:
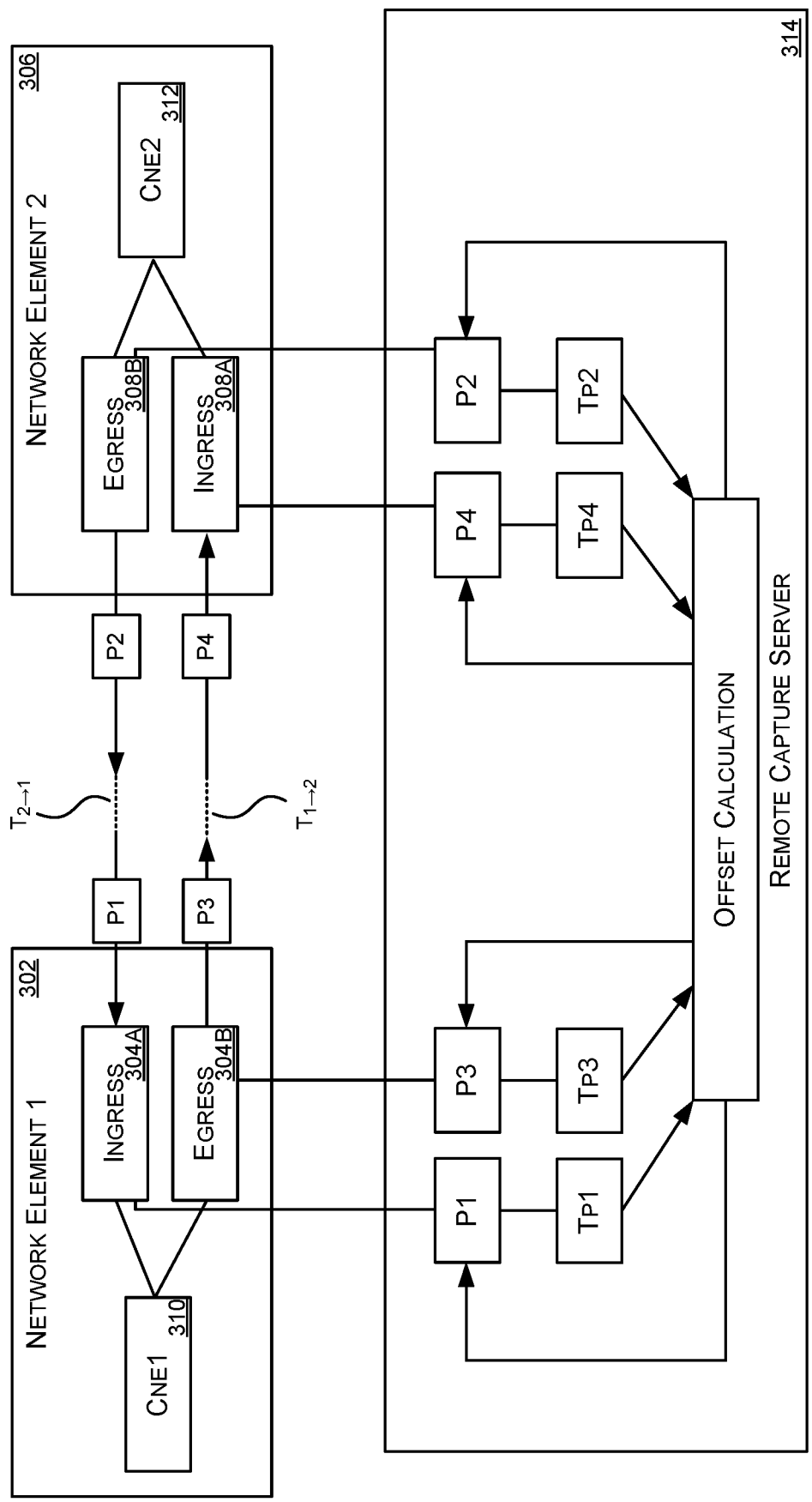
FIG. 3 is a diagram representing time reconciliation between two network elements.

FIG. 3 shows an illustrative example of how the remote capture server generates corrected timestamps for the captured data packets which works in synergy with the data packet association methods described in relation to FIGS. 2A-2C.

In the example shown in FIG. 3, a first (P1), second (P2), third (P3) and fourth (P4) data packets are received by the remote capture server 314 which are captured at a first network element 302 ingress capture point 304A, a second network element 306 element egress capture point 308B, the first network element 302 egress capture point 304B and the second network element 306 ingress capture point 308A respectively.

The data packets are each assigned a timestamp generated by the network element in which the capture of the data packet occurred. In the example shown in FIG. 3, data packets P1 and P3 are assigned timestamps ($T_{P1}$ and $T_{P3}$) using the internal clock of the first network element $C_{NE1}$ 310 whereas data packets P2 and P4 are assigned timestamps ($T_{P2}$ and $T_{P4}$) using the internal clock of the second network element $C_{NE2}$ 312. The timestamps are recorded by the remote capture server 314 along with the payload and metadata of the data packets.

Using the method illustrated in FIG. 2A (i.e., egress to ingress association of data packets), data packets P1 and P2 are associated, and data packets P3 and P4 are associated. Therefore, for a media slice corresponding to P1 and P2, the recorded 'send' time from network element 2 is $T_{P2}$ and the recorded 'receive' time at network element 1 is $T_{P1}$. The time at which P1 is captured at the ingress capture point of the first network element would be after the time at which P2 is captured at the egress capture point of the second network element. Similarly, the time at which P4 is captured would be after the time at which P3 is captured.

To estimate a time offset between $C_{NE1}$ and $C_{NE2}$, the remote capture server calculates the difference between $T_{P1}$ and $T_{P2}$ as well as the difference between $T_{P3}$ and $T_{P4}$. The remote capture server uses these differences to estimate the time offsets at the time the media slice was transmitted between the first and second network elements. This estimated time offset is then applied to the timestamps stored for the data packets to generate corrected timestamps.

Therefore, the remote capture server can dynamically calibrate the timestamps for every captured data packet on a per data packet basis by using the difference in the timestamps assigned to data packets being sent/received by adjacent network elements.

In one example embodiment, the remote capture server estimates the time offset using the following method:

From FIG. 3, the difference between $T_{P2}$ and $T_{P1}$ is equal to the data packet transit time from the second to the first network element ($t_{2 \rightarrow 1}$)+the amount $C_{NE1}$ is ahead of $C_{NE2}$. It is impossible for $t_{2 \rightarrow 1}$ to be negative, and so the amount $C_{NE1}$ is ahead of $C_{NE2}$ is at most the gap between 'send' at the second network element ($T_{P2}$) and 'receive' at the first network element ($T_{P1}$)—call this $\Delta T_1$ (i.e., $T_{P2}-T_{P1}$).

The difference between $T_{P3}$ and $T_{P4}$ is equal to the data packet transit time from the first to the second ($t_{1\to 2}$)+the amount $C_{NE2}$ is ahead of $C_{NE1}$. Again, it is impossible for $t_{1\to 2}$ to be negative, and so the amount $C_{NE2}$ is ahead of $C_{NE1}$ is at most the gap between 'send' at the first network element ($T_{P3}$) and 'receive' at the second network element ($T_{P4}$)—call this $\Delta T_2$ (i.e., $T_{P3}-T_{P4}$).

Thus:

$$C_{NE1}-C_{NE2} \le \Delta T_1$$

$$C_{NE2}-C_{NE1} \le \Delta T_2$$

rearranged: $C_{NE1}-C_{NE2} \ge -\Delta T_2$ and therefore: $-\Delta T_2 \le C_{NE1}-C_{NE2} \le \Delta T_1$ Put differently, using the above logic, infer that $C_{NE1}$ is ahead of $C_{NE2}$ by at most ($T_{P1}-T_{P2}$) and at least ($T_{P3}-T_{P4}$). This provides an upper and lower value of a time offset estimation.

The method of time reconciliation described herein in relation to FIG. 3 enables the remote capture server to Using a worked example:
$T_{P1}=5$
$T_{P2}=0$
$T_{P3}=6$
$T_{P4}=1$
Therefore, $$\Delta T_2=6-1=5$$

$$\Delta T_1=0-5=-5$$

Thus, $$-5 \le C_{NE1}-C_{NE2} \le -5$$

From this worked example, the time offset between $C_{NE1}$ and $C_{NE2}$ is estimated to be 5 when the data packets P1, P2, P3 and P4 were exchanged between the first and second network elements.

Although it is not illustrated in FIG. 3, the remote capture server can calculate time offsets between the internal clocks of more than two network elements. For example, the time offset can be calculated between internal clocks of the second network element and a third network element. Because the time offset between the first and second network elements has been calculated, the time offset between the first and third network elements can be inferred from the time offset between the second and third network elements. By repeating this process throughout the network for data packets associated with one another, the remote capture server can generate a common time frame of reference such that the order of data packet capture events associated with a media slice can be generated.

By applying the methods of data packet association as described in relation to FIGS. 2A-2C and the method of time reconciliation described in relation to FIG. 3, the remote capture server can generate and store an ordered sequence of each data packet capture event corresponding to a media slice. The generation and storage of the ordered sequence is performed automatically (using the rule-based methods described in relation to FIGS. 2A-2C and FIG. 3) and so a diagnosis application, or a network engineer is provided with the means to access the tracking history on demand without having to sort through data packets and perform manual data packet association. This enables the quick and efficient identification of causes of issues within a network.

Figure 4:
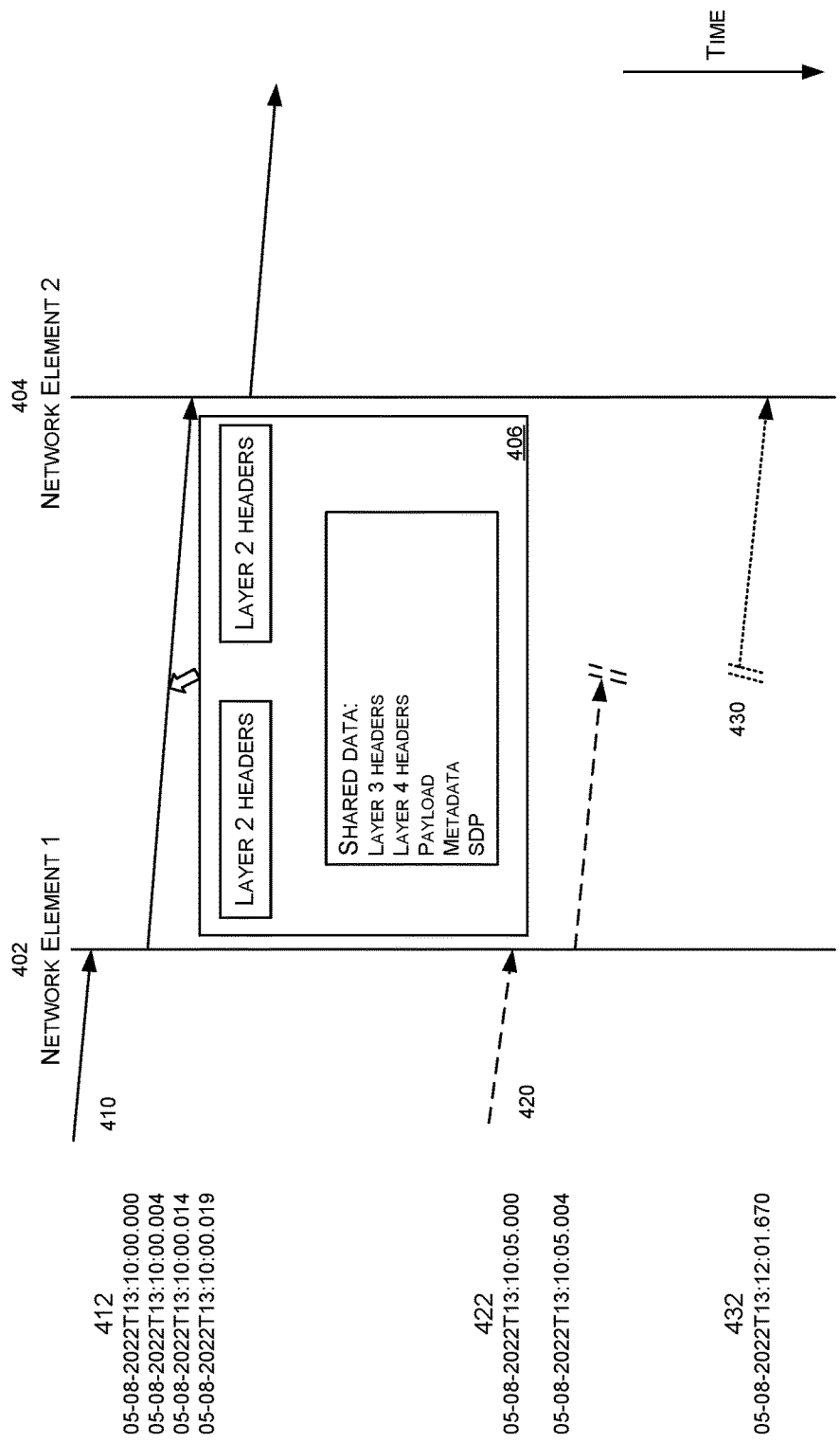
FIG. 4 is a diagram of a time flow representation of media slices traversing a network.

In an embodiment, the results of the ordered sequence generated by the remote capture server are output at a graphical user interface or other display in a format such as that illustrated in FIG. 4. FIG. 4 is only one example of such as display and is not intended to be limiting.

FIG. 4 represents a time flow of media slices traversing a network (represented by arrows 410, 420 and 430) as they enter/exit a first network element (represented by a vertical line) 402 and a second network element 404 (represented by a vertical line). The arrows representing the flow of data packets are shown to be non-horizontal to reflect the transit time of data packets between network elements; that is the relative vertical position of the arrows represents chronological order.

The data packet flow 410 is generated using the logged capture events 412. The first capture event (at the ingress capture point of network element 1 402) is recorded as the first entry (05-08-2022T13:10:00.000). The second capture event (at the egress capture point of network element 1 402) is recorded as the second entry (05-08-2022T13: 10:00.004). The third capture event (at the ingress capture point of network element 2 404) is recorded as the third entry (05-08-2022T13:10:00.014). The fourth capture event (at the egress capture point of network element 2 404) is recorded as the fourth entry (05-08-2022T13:10:00.019).

Differences and commonalities between associated data packets are stored and accessible as shown by 406. In this case, because the data packet exiting network element 1 and the data packet entering network element 2 share the same payload, the two data packets are associated by the remote capture server as being part of the same media slice. The data packets are represented by a continuous flow due to their association as shown by the data flow 410. The differences represent information that was altered by the network between the two network elements.

Although it is not included in FIG. 4, the same differences and commonalities information is available for data packets entering and exiting one network element. In this scenario, the differences represent information that was altered by the network element itself.

The data packet flow 420 is an example of where a data packet is sent by network element 1 but is not received by network element 2. The data packet flow 430 is an example of where a data packet is received by network element 2 but it was not sent by network element 1. In this example scenario, the data packets from 420 are not associated with the data packets from 430 as they do not share the same payload.

Using the display of FIG. 4 an engineer is quickly able to determine how media slices are treated in the communications network between two communications network nodes.

FIGS. 5A and 5B are a flow diagram representing an example of a method 500 for associating data packets corresponding to the processes illustrated in FIG. 2A and FIG. 2B. The method 500, performed by a remote capture server, serves to track a media slice through at least part of a communications network.

At 502 of the method 500, the remote capture server inspects a first payload of a first data packet observed at an egress capture point of a first network element.

At 504 of the method 500, the remote capture server inspects a second payload of a second data packet observed at an ingress capture point of a second network element.

At 506 of the method 500, the remote capture server compares the first payload with the second payload and, at 508 the remote capture server associates the first data packet with the second data packet in response to determining that the first payload and the second payload are the same. The first and second data packets correspond to a first media slice in response to determining that the first and second data packets are associated.

At 510 of the method 500, the remote capture server inspects a third payload and/or metadata of a third data packet observed at the ingress capture point of the second network element.

At 512 of the method 500, the remote capture server inspects a fourth payload and/or metadata of a fourth data packet observed at the egress capture point of the second network element.

At 514 of the method 500, the remote capture server compares the third payload and/or metadata of a third data packet with the fourth payload and/or metadata of a fourth data packet and, at 516 associates the third data packet with the fourth data packet in response to determining the third payload and/or metadata of the third data packet and the fourth payload and/or metadata of the fourth data packet are the same. The third and fourth data packets correspond to a second media slice in response to determining that the third and fourth data packets are associated.

In some embodiments, comparing the third payload and/or metadata of the third data packet and the fourth payload and/or metadata of the fourth data packet comprises at least one of: inspecting and comparing the payloads of the third and fourth data packets, and/or assessing whether the third and fourth data packets are equal under the relevant process of transcoding, and/or assessing a transrating protocol from the metadata of the third and fourth data packets. The method of comparing the third payload and/or metadata of the third data packet and the fourth payload and/or metadata of the fourth data packet is selected based on a CPU resource value of the remote capture server in some embodiments.

In response to determining that the second data packet and the third data packet are the same data packet, the remote capture server, at 518, associates the first, second or third, and fourth data packets and records the first and second media slices as a common media slice at 520.

In response to determining that the second data packet and the third data packet are not the same data packer, the remote capture server, at 522, records the first and second media slices as different media slices.

In some embodiments, the method 500 comprises generating a graphical representation of the network elements and the media slices for display to a user at 524.

FIG. 6 is a flow diagram representing a method 600 for generating corrected timestamps for data packets corresponding to the process illustrated in FIG. 2C. The method 600 follows the method 500 wherein the following acts are performed in response to determining the first, second or third, and fourth data packets are associated.

At 602 of the method 600, the remote capture server inspects a first timestamp assigned to the first data packet, wherein the first timestamp is generated by the first network element.

At 604 of the method 600, the remote capture server inspects a second timestamp assigned to the second or third data packet, wherein the second timestamp is generated by the second network element.

At 606 of the method 600, the remote capture server inspects a third timestamp assigned to the fourth data packet, wherein the third timestamp is generated by the second network element.

At 608 of the method 600, the remote capture server inspects a fourth timestamp assigned to a fifth data packet, wherein the fifth data packet is recorded at the ingress of the first network element and the fifth data packet is associated with the fourth data packet, wherein the fourth timestamp is generated by the first network element.

At 610 of the method 600, the remote capture server estimates a time offset between the first and second network elements using the difference between the first and second timestamp and the difference between the third and fourth timestamp.

At 612 of the method 600, the remote capture server applies the time offset to the first, second, third and fourth timestamps to generate first, second, third and fourth corrected timestamps.

At 614 of the method 600, the remote capture server records in the log the correct timestamps with their assigned data packets.

In some examples, the remote capture server, at 616, orders at least one of the first, second or third, fourth and fifth data packets according to the values of the corrected timestamps for the first, second, third, fourth and fifth data packets.

Figure 7:
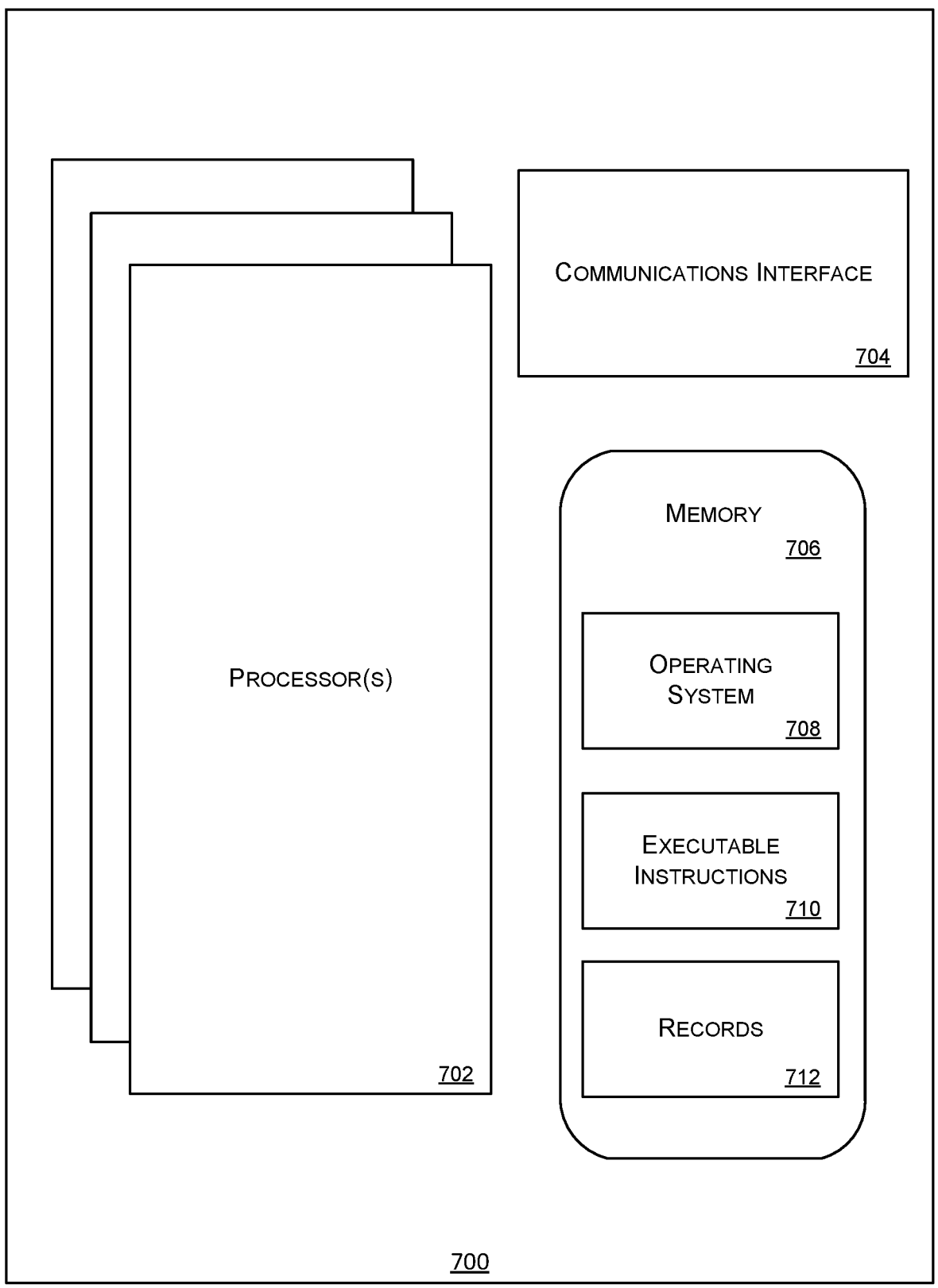
FIG. 7 illustrates an exemplary computing-based device in which embodiments of 500 and 600 are implemented.

FIG. 7 illustrates various components of an exemplary computing-based device 700 which are implemented as any form of a computing and/or electronic device, and in which embodiments of a remote capture server are implemented in some examples.

Computing-based device 700 comprises one or more processors 702 which are microprocessors, controllers or any other suitable type of processors for processing computer executable instructions 710 to control the operation of the device in order to track media slices through a communications network such as by performing the methods of FIGS. 5 and 6. In some examples, for example where a system on a chip architecture is used, the processors 702 include one or more fixed function blocks (also referred to as accelerators) which implement a part of the method of FIGS. 5 and 6 in hardware (rather than software or firmware). Platform software comprising an operating system 708 or any other suitable platform software is provided at the computing-based device to enable application software to be executed on the device. Records 712 are stored at the computing based device and comprise metadata, packet data, packets, media flow data or other information.

The computer executable instructions 710 are provided using any computer-readable media that is accessible by computing based device. Computer-readable media includes, for example, computer storage media such as memory 706 and communications media. Computer storage media, such as memory 706, includes volatile and non-volatile, removable and non-removable media implemented in any method or technology for storage of information such as computer readable instructions, data structures, program modules or the like. Computer storage media includes, but is not limited to, random access memory (RAM), read only memory (ROM), erasable programmable read only memory (EPROM), electronic erasable programmable read only memory (EEPROM), flash memory or other memory technology, compact disc read only memory (CD-ROM), digital versatile disks (DVD) or other optical storage, magnetic cassettes, magnetic tape, magnetic disk storage or other magnetic storage devices, or any other non-transmission medium that is used to store information for access by a computing device. In contrast, communication media embody computer readable instructions, data structures, program modules, or the like in a modulated data signal, such as a carrier wave, or other transport mechanism. As defined herein, computer storage media does not include communication media. Therefore, a computer storage medium should not be interpreted to be a propagating signal per se. Although the computer storage media (memory 706) is shown within the computing-based device 700 it will be appreciated that the storage is, in some examples, distributed or located remotely and accessed via a network or other communication link (e.g. using communication interface 704).

Alternatively or in addition to the other examples described herein, examples include any combination of the following:

Clause 1. A method, performed by a remote capture server, is provided of tracking a media slice through at least part of a communications network comprising a plurality of network elements, the method comprising: inspecting a first payload of a first data packet observed at an egress capture point of a first network element; inspecting a second payload of a second data packet observed at an ingress capture point of a second network element; comparing the first payload with the second payload; associating the first data packet with the second data packet in response to determining that the first payload and the second payload are the same; wherein the first and second data packets correspond to a first media slice in response to determining they are associated; inspecting a third payload and/or metadata of a third data packet observed at the ingress capture point of the second network element; inspecting a fourth payload and/or metadata of a fourth data packet observed at the egress capture point of the second network element; comparing the third payload and/or metadata of the third data packet with the fourth payload and/or metadata of the fourth data packet; associating the third data packet with the fourth data packet in response to determining the third payload and/or metadata of the third data packet and the fourth payload and/or metadata of the fourth data packet are the same; wherein the third and fourth data packets correspond to a second media slice in response to determining they are associated; and wherein in response to determining that the second data packet and the third data packet are the same data packet: associating the first, second or third, and fourth data packets; and recording the first and second media slices as a common media slice; wherein in response to determining that the second data packet and the third data packet are not the same data packet: recording the first and second media slices as different media slices.

Clause 2. The method of clause 1, in response to determining the first, second or third, and fourth data packets are associated, further comprising: inspecting a first timestamp assigned to the first data packet, wherein the first timestamp is generated by the first network element; inspecting a second timestamp assigned to the second or third data packet, wherein the second timestamp is generated by the second network element; inspecting a third timestamp assigned to the fourth data packet, wherein the third timestamp is generated by the second network element; inspecting a fourth timestamp assigned to a fifth data packet, wherein the fifth data packet is recorded at the ingress of the first network element and the fifth data packet is associated with the fourth data packet, wherein the fourth timestamp is generated by the first network element; estimating a time offset between the first and second network elements using the difference between the first and second timestamp and the difference between the third and fourth timestamp; applying the time offset to the first, second, third and fourth timestamps to generate first, second, third and fourth corrected timestamps; and recording in the log the corrected timestamps with their assigned data packets.

Clause 3. The method of clause 2, comprising ordering at least one of the first, second, third, fourth and fifth data packets according to the values of the corrected timestamps for the first, second, third, fourth and fifth data packets.

Clause 4. The method of clause 2 or clause 3, wherein the estimation of the time offset is at most the difference between first and second timestamps.

Clause 5. The method of any of clauses 2 to 4, wherein the estimation of the time offset is at least the difference between the third and fourth timestamps.

Clause 6. The method of any of clauses 2 to 5, wherein the estimation of the time offset is repeated for data packets received subsequent to the fifth data packet and previous time offset estimations are discarded.

Clause 7. The method of any previous clause, wherein comparing the third payload and/or metadata of the third data packet and the fourth payload and/or metadata of the fourth data packet comprises at least one of: inspecting and comparing the payloads of the third and fourth data packets; and/or assessing whether the third and fourth data packets are equal under the relevant process of transcoding; and/or assessing a transrating protocol from the metadata of the third and fourth data packets.

Clause 8. The method of clause 7, wherein the method of comparing the payload and/or metadata of the third data packet and the payload and/or metadata of the fourth data packet is selected based on a CPU resource value of the remote capture server.

Clause 9. The method of any preceding clause, further comprising: upon comparing the first and second data packets, identifying differences and commonalities in between the first and second data packets; recording the differences and commonalities between the first and second data packets in the log; upon comparing the third and fourth data packets, identifying differences and commonalities in between the third and fourth data packets; and recording the differences and commonalities between the third and fourth data packets in the log.

Clause 10. The method of clause 9, wherein the differences and/or commonalities are at least one of: the one or more layer headers, the service delivery platform, the payload or the metadata.

Clause 11. The method of any preceding clause, generating a graphical representation of the network elements and the media slices for display to a user.

Clause 12. The method of any of clauses 2 to 11, the method further comprising: prior to inspecting, receiving copies of the first, second, third, fourth and fifth data packets; wherein the first data packets are each encapsulated in another data packet such that the first, second, third, fourth and fifth data packets are unchanged as they travel to the remote capture server.

Clause 13. A remote capture server for tracking a media slice through at least part of a communications network comprising a plurality of network elements, wherein the remote capture server is configured to: inspect a first payload of a first data packet observed at an egress capture point of a first network element; inspect a second payload of a second data packet observed at an ingress capture point of a second network element; compare the first payload with the second payload; associate the first data packet with the second data packet in response to determining that the first payload and the second payload are the same; wherein the first and second data packets correspond to a first media slice in response to determining they are associated; inspect a third payload and/or metadata of a third data packet observed at the ingress capture point of the second network element;

inspect a fourth payload and/or metadata of a fourth data packet observed at the egress capture point of the second network element; compare the third payload and/or metadata of the third data packet with the fourth payload and/or metadata of the fourth data packet; associate the third data packet with the fourth data packet in response to determining the third payload and/or metadata of the third data packet and the fourth payload and/or metadata of the fourth data packet are the same; wherein the third and fourth data packets correspond to a second media slice in response to determining they are associated; and wherein in response to determining that the second data packet and the third data packet are the same data packet: associate the first, second or third, and fourth data packets; and record the first and second media slices as a common media slice; wherein in response to determining that the second data packet and the third data packet are not the same data packet: record the first and second media slices as different media slices.

Clause 14. The remote capture server of clause 13, in response to determining the first, second or third, and fourth data packets are associated, the remote capture server further configured to: inspect a first timestamp assigned to the first data packet, wherein the first timestamp is generated by the first network element; inspect a second timestamp assigned to the second or third data packet, wherein the second timestamp is generated by the second network element; inspect a third timestamp assigned to the fourth data packet, wherein the third timestamp is generated by the second network element; inspect a fourth timestamp assigned to a fifth data packet, wherein the fifth data packet is recorded at the ingress of the first network element and the fifth data packet is associated with the fourth data packet, wherein the fourth timestamp is generated by the first network element; estimate a time offset between the first and second network elements using the difference between the first and second timestamp and the difference between the third and fourth timestamp; apply the time offset to the first, second, third and fourth timestamps to generate first, second, third and fourth corrected timestamps; and record in the log the corrected timestamps with their assigned data packets.

Clause 15. The remote capture server of clause 14, the remote capture server further configured to: order at least one of the first, second, third, fourth and fifth data packets according to the values of the corrected timestamps for the first, second, third, fourth and fifth data packets.

Clause 16. The remote capture server of any of clauses 13 to 15, wherein the estimation of the time offset is at most the difference between first and second timestamps.

Clause 17. The remote capture server of any of clauses 13 to 16, wherein the estimation of the time offset is at least the difference between the third and fourth timestamps.

Clause 18. The remote capture server of any of clauses 13 to 17, the remote capture server further configured to: generate a graphical representation of the network elements and the media slices for display to a user.

Clause 19. A method, performed by a remote capture server, of tracking a media slice through at least part of a communications network comprising a plurality of network element is provided, the method comprising: inspecting a first payload of a first data packet observed at an egress capture point of a first network element; inspecting a second payload of a second data packet observed at an ingress capture point of a second network element; comparing the first payload with the second payload; associating the first data packet with the second data packet in response to determining that the first payload and the second payload are the same; wherein the first and second data packets correspond to a first media slice in response to determining they are associated; inspecting a third payload and/or metadata of a third data packet observed at the ingress capture point of the second network element; inspecting a fourth payload and/or metadata of a fourth data packet observed at the egress capture point of the second network element; comparing the third payload and/or metadata of the third data packet with the fourth payload and/or metadata of the fourth data packet; associating the third data packet with the fourth data packet in response to determining the third payload and/or metadata of the third data packet and the fourth payload and/or metadata of the fourth data packet are the same; wherein the third and fourth data packets correspond to a second media slice in response to determining they are associated; wherein in response to determining that the second data packet and the third data packet are the same data packet: associating the first, second or third, and fourth data packets; and recording the first and second media slices as a common media slice; wherein in response to determining that the second data packet and the third data packet are not the same data packet: recording the first and second media slices as different media slices; wherein in response to determining the first, second or third, and fourth data packets are associated, the method further comprising: inspecting a first timestamp assigned to the first data packet, wherein the first timestamp is generated by the first network element; inspecting a second timestamp assigned to the second or third data packet, wherein the second timestamp is generated by the second network element; inspecting a third timestamp assigned to the fourth data packet, wherein the third timestamp is generated by the second network element; inspecting a fourth timestamp assigned to a fifth data packet, wherein the fifth data packet is recorded at the ingress of the first network element and the fifth data packet is associated with the fourth data packet, wherein the fourth timestamp is generated by the first network element; estimating a time offset between the first and second network elements using the difference between the first and second timestamp and the difference between the third and fourth timestamp; applying the time offset to the first, second, third and fourth timestamps to generate first, second, third and fourth corrected timestamps; and recording in the log the corrected timestamps with their assigned data packets.

Clause 20. A computer-readable medium comprising instructions which, when executed by a processor, cause the processor to carry out a method of tracking a media slice through at least part of a communications network comprising a plurality of network elements, the method comprising: inspecting a first payload of a first data packet observed at an egress capture point of a first network element; inspecting a second payload of a second data packet observed at an ingress capture point of a second network element; comparing the first payload with the second payload; associating the first data packet with the second data packet in response to determining that the first payload and the second payload are the same; wherein the first and second data packets correspond to a first media slice in response to determining they are associated; inspecting a third payload and/or metadata of a third data packet observed at the ingress capture point of the second network element; inspecting a fourth payload and/or metadata of a fourth data packet observed at the egress capture point of the second network element; comparing the third payload and/or metadata of the third data packet with the fourth payload and/or metadata of the fourth data packet; associating the third data packet with the fourth data packet in response to determining the third payload and/or metadata of the third data packet and the fourth payload and/or metadata of the fourth data packet are the same; wherein the third and fourth data packets correspond to a second media slice in response to determining they are associated; and wherein in response to determining that the second data packet and the third data packet are the same data packet: associating the first, second or third, and fourth data packets; and recording the first and second media slices as a common media slice; wherein in response to determining that the second data packet and the third data packet are not the same data packet: recording the first and second media slices as different media slices.

The term 'computer' or 'computing-based device' is used herein to refer to any device with processing capability such that it executes instructions. Those skilled in the art will realize that such processing capabilities are incorporated into many different devices and therefore the terms 'computer' and 'computing-based device' each include personal computers (PCs), servers, mobile telephones (including smart phones), tablet computers, set-top boxes, media players, games consoles, personal digital assistants, wearable computers, and many other devices.

The methods described herein are performed, in some examples, by software in machine readable form on a tangible storage medium e.g. in the form of a computer program comprising computer program code means adapted to perform all the operations of one or more of the methods described herein when the program is run on a computer and where the computer program may be embodied on a computer readable medium. The software is suitable for execution on a parallel processor or a serial processor such that the method operations may be carried out in any suitable order, or simultaneously.

Those skilled in the art will realize that storage devices utilized to store program instructions are optionally distributed across a network. For example, a remote computer is able to store an example of the process described as software. A local or terminal computer is able to access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a digital signal processor (DSP), programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the scope of this specification.

The configurations described above enable various methods for providing user input to a computer system. Some such methods are now described, by way of example, with continued reference to the above configurations. It will be understood, however, that the methods here described, and others within the scope of this disclosure, may be enabled by different configurations as well. The methods herein, which involve the observation of people in their daily lives, may and should be enacted with utmost respect for personal privacy. Accordingly, the methods presented herein are fully compatible with opt-in participation of the persons being observed. In embodiments where personal data is collected on a local system and transmitted to a remote system for processing, that data can be anonymized in a known manner. In other embodiments, personal data may be confined to a local system, and only non-personal, summary data transmitted to a remote system.

What is claimed is:

1. A method, performed by a remote capture server, for tracking a media slice through at least part of a communications network comprising a plurality of network elements, the method comprising:
   inspecting a first payload of a first data packet observed at an egress capture point of a first network element;
   inspecting a second payload of a second data packet observed at an ingress capture point of a second network element;
   comparing the first payload with the second payload;
   determining that the first payload and the second payload comprise same content;
   associating the first data packet with the second data packet; wherein
      the first and second data packets correspond to a first media slice;
   inspecting a third payload or metadata of a third data packet observed at the ingress capture point of the second network element;
   inspecting a fourth payload or metadata of a fourth data packet observed at the egress capture point of the second network element;
   comparing the third payload or metadata of the third data packet with the fourth payload or metadata of the fourth data packet;
   determining the third payload or metadata of the third data packet and the fourth payload or metadata of the fourth data packet comprise same content;

associating the third data packet with the fourth data packet, wherein the third and fourth data packets correspond to a second media slice;

determining that the second data packet and the third data packet comprise same content:

associating the first, second or third, and fourth data packets; and recording the first and second media slices as a common media slice.

2. The method of claim 1, further comprising in response to determining the first, second or third, and fourth data packets are associated:

inspecting a first timestamp assigned to the first data packet, wherein the first timestamp is generated by the first network element;

inspecting a second timestamp assigned to the second or third data packet, wherein the second timestamp is generated by the second network element;

inspecting a third timestamp assigned to the fourth data packet, wherein the third timestamp is generated by the second network element;

inspecting a fourth timestamp assigned to a fifth data packet, wherein the fifth data packet is recorded at the ingress of the first network element and the fifth data packet is associated with the fourth data packet, wherein the fourth timestamp is generated by the first network element;

estimating a time offset between the first and second network elements using a difference between the first and second timestamp and a difference between the third and fourth timestamp;

applying the time offset to the first, second, third and fourth timestamps to generate first, second, third and fourth corrected timestamps; and recording, in a log, the first, second, third, and fourth corrected timestamps with the first, second or third, fourth, and fifth data packets.

3. The method of claim 2, further comprising ordering at least one of the first, second, third, fourth, and fifth data packets according to values of the corrected timestamps for the first, second, third, fourth, and fifth data packets.

4. The method of claim 2, wherein the estimation of the time offset is at most the difference between first and second timestamps.

5. The method of claim 2, wherein the estimation of the time offset is at least the difference between the third and fourth timestamps.

6. The method of claim 1, further comprising generating a graphical representation of the first and second network elements and the first and second media slices for display to a user.

7. A remote capture server for tracking a media slice through at least part of a communications network comprising a plurality of network elements, the remote capture server comprising a memory and a processor, the memory storing thereon computer-executable instructions that, when executed by the processor, cause the remote capture server to perform operations comprising:

inspect a first payload of a first data packet observed at an egress capture point of a first network element;

inspect a second payload of a second data packet observed at an ingress capture point of a second network element;

compare the first payload with the second payload;

associate the first data packet with the second data packet in response to determining that the first payload and the second payload are identical; wherein the first and second data packets correspond to a first media slice when the first and second data packets are associated;

inspect a third payload and/or metadata of a third data packet observed at the ingress capture point of the second network element;

inspect a fourth payload or metadata of a fourth data packet observed at the egress capture point of the second network element;

compare the third payload or metadata of the third data packet with the fourth payload or metadata of the fourth data packet;

associate the third data packet with the fourth data packet in response to determining the third payload or metadata of the third data packet and the fourth payload or metadata of the fourth data packet are identical; wherein the third and fourth data packets correspond to a second media slice when the third and fourth data packets are associated;

in response to determining that the second data packet and the third data packet are identical:

associate the first, second or third, and fourth data packets; and record the first and second media slices as a common media slice; and in response to determining that the second data packet and the third data packet are not identical data packets:

record the first and second media slices as different media slices.

8. The remote capture server of claim 7, further comprising computer-executable instructions that, when executed by the processor, cause the remote capture server to perform operations comprising:

in response to determining that the first, second or third, and fourth data packets are associated:

inspect a first timestamp assigned to the first data packet, wherein the first timestamp is generated by the first network element;

inspect a second timestamp assigned to the second or third data packet, wherein the second timestamp is generated by the second network element;

inspect a third timestamp assigned to the fourth data packet, wherein the third timestamp is generated by the second network element;

inspect a fourth timestamp assigned to a fifth data packet, wherein the fifth data packet is recorded at the ingress of the first network element and the fifth data packet is associated with the fourth data packet, wherein the fourth timestamp is generated by the first network element;

estimate a time offset between the first and second network elements using a difference between the first and second timestamp and a difference between the third and fourth timestamp;

apply the time offset to the first, second, third and fourth timestamps to generate first, second, third and fourth corrected timestamps; and record in a log the corrected first, second, third, and fourth timestamps with the first, second or third, fourth, and fifth data packets.

9. The remote capture server of claim 8, further comprising computer-executable instructions that, when executed by the processor, cause the remote capture server to perform operations comprising: order at least one of the first, second, third, fourth and fifth data packets according to values of the corrected timestamps for the first, second, third, fourth and fifth data packets.

10. The remote capture server of claim 8, wherein the estimation of the time offset is at most the difference between first and second timestamps.

11. The remote capture server of claim 8, wherein the estimation of the time offset is at least the difference between the third and fourth timestamps.

12. The remote capture server of claim 8, wherein the estimation of the time offset is repeated for data packets received subsequent to the fifth data packet and previous time offset estimations are discarded.

13. The remote capture server of claim 8, further comprising computer-executable instructions that, when executed by the processor, cause the remote capture server to perform operations comprising:
prior to inspecting, receiving copies of the first, second, third, fourth and fifth data packets; and
encapsulating the copies of the first, second, third, fourth and fifth data packets in additional data packets such that the first, second, third, fourth and fifth data packets are unchanged when sending the copies to the remote capture server.

14. The remote capture server of claim 7, further comprising computer-executable instructions that, when executed by the processor, cause the remote capture server to perform operations comprising: generate a graphical representation of the first and second network elements and the first and second media slices for display to a user.

15. The remote capture server of claim 7, wherein comparing the third payload or metadata of the third data packet and the fourth payload or metadata of the fourth data packet comprises at least one of:
inspecting and comparing the payloads of the third and fourth data packets; or
assessing whether the third and fourth data packets are equal under a process of transcoding; or
assessing a transrating protocol from the metadata of the third and fourth data packets.

16. The remote capture server of claim 15, wherein the comparing the payload or metadata of the third data packet and the payload or metadata of the fourth data packet is selected based on a central processing unit (CPU) resource value of the remote capture server.

17. The remote capture server of claim 7, further comprising computer-executable instructions that, when executed by the processor, cause the remote capture server to perform operations comprising:
in response to comparing the first and second data packets, identifying differences and commonalities between the first and second data packets;
recording the differences and commonalities between the first and second data packets in a log;
in response to comparing the third and fourth data packets, identifying differences and commonalities between the third and fourth data packets; and
recording the differences and commonalities between the third and fourth data packets in the log.

18. The remote capture server of claim 17, wherein the differences or commonalities between the first and second data packets and between third and fourth data packets are at least one of: one or more layer headers, a service delivery platform, the corresponding payload, or the metadata.

19. A computer-readable storage medium comprising instructions which, when executed by a processor of a computing device, cause the computing device to perform operations for tracking a media slice through at least part of a communications network comprising a plurality of network elements, the operations comprising:
inspecting a first payload of a first data packet observed at an egress capture point of a first network element;
inspecting a second payload of a second data packet observed at an ingress capture point of a second network element;
comparing the first payload with the second payload;
associating the first data packet with the second data packet in response to determining that the first payload and the second payload are identical; wherein
the first and second data packets correspond to a first media slice when the first data packet with the second data packet are associated;
inspecting a third payload or metadata of a third data packet observed at the ingress capture point of the second network element;
inspecting a fourth payload or metadata of a fourth data packet observed at the egress capture point of the second network element;
comparing the third payload or metadata of the third data packet with the fourth payload or metadata of the fourth data packet;
associating the third data packet with the fourth data packet in response to determining the third payload or metadata of the third data packet and the fourth payload or metadata of the fourth data packet are identical wherein
the third and fourth data packets correspond to a second media slice when the third and fourth data packets are associated;
in response to determining that the second data packet and the third data packet are identical:
associating the first, second or third, and fourth data packets; and
recording the first and second media slices as a common media slice; and
in response to determining that the second data packet and the third data packet are not identical:
recording the first and second media slices as different media slices.

20. The computer-readable storage medium of claim 19, further comprising instructions which, when executed by the processor of the computing device, cause the computing device to perform operations comprising:
in response to determining that the first, second or third, and fourth data packets are associated:
inspecting a first timestamp assigned to the first data packet, wherein the first timestamp is generated by the first network element;
inspecting a second timestamp assigned to the second or third data packet, wherein the second timestamp is generated by the second network element;
inspecting a third timestamp assigned to the fourth data packet, wherein the third timestamp is generated by the second network element;
inspecting a fourth timestamp assigned to a fifth data packet, wherein the fifth data packet is recorded at the ingress of the first network element and the fifth data packet is associated with the fourth data packet, wherein the fourth timestamp is generated by the first network element;
estimating a time offset between the first and second network elements using a difference between the first and second timestamp and a difference between the third and fourth timestamp;

applying the time offset to the first, second, third and fourth timestamps to generate first, second, third and fourth corrected timestamps; and recording in a log the corrected first, second, third, and fourth timestamps with the first, second or third, fourth, and fifth data packets.

\* \* \* \* \*